United States Patent [19]
Reffay et al.

[11] Patent Number: 5,910,748
[45] Date of Patent: Jun. 8, 1999

[54] POWER AMPLIFIER IN BICMOS TECHNOLOGY HAVING AN OUTPUT STAGE IN MOS TECHNOLOGY

[75] Inventors: Marius Reffay, Grenoble; Danika Chaussy, Montchaboud, both of France

[73] Assignee: STMicroelectronics, S.A., Gentilly, France

[21] Appl. No.: 08/893,248

[22] Filed: Jul. 16, 1997

[30] Foreign Application Priority Data

Jul. 16, 1996 [FR] France ................................. 96 09131

[51] Int. Cl.⁶ ................................................. H03K 17/60
[52] U.S. Cl. ........................ 327/432; 327/433; 327/108
[58] Field of Search ...................... 326/83, 84; 323/315; 327/103, 108, 432, 433, 560

[56] References Cited

U.S. PATENT DOCUMENTS

| | | | |
|---|---|---|---|
| 4,047,059 | 9/1977 | Rosenthal | 327/66 |
| 4,570,128 | 2/1986 | Monticelli | 330/267 |
| 4,943,737 | 7/1990 | Guo et al. | 323/315 |
| 5,055,796 | 10/1991 | Schaffer | 330/263 |
| 5,361,040 | 11/1994 | Barrett, Jr. | 330/253 |
| 5,475,343 | 12/1995 | Bee | 330/255 |
| 5,523,709 | 6/1996 | Phillips et al. | 327/143 |
| 5,637,992 | 6/1997 | Edwards | 323/315 |

FOREIGN PATENT DOCUMENTS 0 541 164 A1  5/1993  European Pat. Off. .......... H03F 3/30

*Primary Examiner*—Toan Tran
*Attorney, Agent, or Firm*—David V. Carlson; Seed & Berry LLP

[57] ABSTRACT

The present invention relates to a power amplifier having an output stage in MOS technology, including an upper half-output stage comprised of two P-channel MOS power transistors mounted as a current mirror, a lower half-output stage comprised of two N-channel MOS power transistors mounted as a current mirror, an output terminal of the amplifier corresponding to the common drains of a first MOS transistor of the upper stage and of a first MOS transistor of the lower stage, and a control stage in bipolar technology for setting, according to a control voltage, two control currents of the half-output stages.

18 Claims, 1 Drawing Sheet

POWER AMPLIFIER IN BICMOS TECHNOLOGY HAVING AN OUTPUT STAGE IN MOS TECHNOLOGY

BACKGROUND OF THE INVENTION

1. Field of the Invention

The present invention relates to the field of current amplifiers having an output stage comprised of MOS transistors. The present invention more specifically applies to the implementation of an amplifier whose output stage includes two MOS transistors mounted in series between two supply lines, usually called a "rail to rail" amplifier. An example of application of the present invention relates to a so-called television set "field circuit" amplifier, the function of which is to control the vertical deviation of the electronic beam of the cathode-ray tube by supplying a deflector coil with a sawtooth-shaped current.

2. Discussion of the Related Art

In such an application, the amplifier has to issue a significant alternating current, for example, of approximately 1 amperes to 3 amperes peak-to-peak.

A push-pull amplifier in bipolar technology receiving, via a transconductance stage and a Miller frequency compensation stage, a sawtooth-shaped signal which needs to be amplified to supply the coil generally is used.

A disadvantage of a push-pull amplifier in bipolar technology is linked with the so-called "second breakdown" phenomenon of bipolar transistors. This phenomenon occurs when a bipolar transistor operates in an area of its current-voltage characteristic which is close to its breakdown voltage. This so-called "second breakdown" area depends, in particular, on the operating time of the amplifier in this area and on the ability of the circuit to dissipate power. Now, for reasons of miniaturization, bipolar transistors have the smallest possible dimensions. They then operate in an area of their current-voltage characteristic which is close to the second breakdown area. In a power amplifier for vertically scanning a television screen, the operating time induces the transistor to reach its second breakdown area. Second breakdown problems thus cannot be neglected.

The progress made in the miniaturization of MOS power transistors has spurred development of power amplifiers in MOS technology which avoid the problem of second breakdown and which give the amplifier greater robustness. For this purpose, amplifiers derived from the structure of low power CMOS amplifiers have been provided.

FIG. 1 schematically shows a conventional example of implementation of an amplifier in CMOS technology.

Such an amplifier includes two, respectively P-channel and N-channel, output transistors M1 and M2 which define the upper and lower half-output stages, respectively. The common drains of transistors M1 and M2 which are mounted in series between two supply lines, respectively V+ and V− (for example the ground), define an output terminal S of the amplifier.

A P-channel transistor M3 is mounted in a current mirror with transistor M1. An N-channel transistor M4 connects the drain of transistor M3 to the gate of transistor M2. The gate of transistor M2 constitutes a control terminal E of the amplifier which receives a positive control voltage Ve, for example, a sawtooth-shaped signal.

When voltage Ve is equal to a nominal voltage Vgs0 corresponding to a zero output voltage and imposed by a feedback (not shown) of the amplifier, a source 1 of current I conditions a current of simultaneous conduction of transistors M1 and M2, or quiescent current of the output stage. In the application to the field circuit of a television set, this quiescent state corresponds to the non-deviated position of the beam. This quiescent current is necessary to avoid a distortion at the linking-up of the positive and negative ranges, respectively, of the output current, that is, to respect the linearity of the output current.

Current I is sent onto the drain of an N-channel transistor M5, mounted in a current mirror with transistor M4. The source of transistor M5 is connected, via an N-channel transistor M6, to line V−.

The quiescent current is set so that, when voltage Ve is equal to Vgs0, the currents through transistors M1 and M2 are equal, with no current flowing through the load (not shown) connected to terminal S. When voltage Ve increases, the current through transistor M3, and thus through transistor M1, decreases and the current through transistor M2 increases. A current thus is drawn from the load. When voltage Ve decreases, the current through transistor M1 increases and the current through transistor M2 decreases. A current thus is delivered to the load.

If such an assembly overcomes the disadvantage of second breakdown in a bipolar assembly, it has several disadvantages for high power applications.

Indeed, as the amplifier supplies current, that is, as transistor M3 is conducting, the current desired to be copied in transistor M1 has to be absorbed at point E. In a power amplifier where the desired output current is, for example, 3 amperes peak-to-peak, and assuming that the ratio of the mirror comprised of transistors M1 and M3 is 100, the current to be absorbed then is approximately 15 mA.

Further, for a power amplifier and in order to respect the linearity of the output current, signal Ve should be made asymmetrical with respect to potential Vgs0.

Moreover, such an amplifier has an input impedance (terminal E) which varies very strongly with voltage Ve and which is, further, asymmetrical according to whether transistor M2 is or not conducting. Indeed, as soon as transistor M2 conducts (as soon as voltage Ve reaches the value of threshold voltage Vgs0 of transistor M2), transistor M4 blocks. The input impedance then is very high since it substantially corresponds to the gate capacity of transistor M2. Conversely, when transistor M1 conducts and transistor M2 is blocked, the input impedance of the amplifier is low and substantially corresponds to the drain-source resistance in the conducting state of transistor M4.

The article "Low Voltage BICMOS and Vertical OTA" by J. Ramirez-Angulo, IEEE PROCEEDINGS G. ELECTRONIC CIRCUITS & SYSTEMS, vol. 139, N° 4 PART G, Aug. 1, 1992, pages 553–556, describes a BICMOS technology amplifier intended for low power applications. This amplifier uses two half output stages comprised of MOS transistors which are controlled by a MOS and bipolar transistor stage. Two control voltages are applied on the respective bases of two bipolar transistors and on the respective gates of two MOS transistors of the control stage. Such a circuit is limited to low excursions of the output current and does not operate correctly at high power (output current of about 1 A) unless power MOS transistors of large size are used at the output, because of the low transconductance of the MOS transistors of the control stage. Moreover, this amplifier needs a reference voltage corresponding to a voltage half way between the power supply voltages. As a consequence, it does not accept a variation of one of the supply voltages.

SUMMARY OF THE INVENTION

The present invention aims at providing a new power amplifier having an output stage in MOS technology which overcomes the above-mentioned disadvantages.

A particular object of the invention is to provide such an amplifier which has a high output current excursion for a low input voltage excursion while maintaining a low quiescent current.

Another object of the invention is to ensure that the output current is not disturbed when one of the supply voltages varies.

Another object of the invention is to ensure that the output current is substantially proportional to the input voltage and that the input impedance is symmetrical and high.

To achieve these objects, the present invention provides a power amplifier having an output stage in MOS technology, including an upper half-output stage comprised of two P-channel MOS power transistors mounted as a current mirror, a lower half-output stage comprised of two N-channel MOS power transistors mounted as a current mirror, an output terminal corresponding to the common drains of a first MOS transistor of the upper stage and of a first MOS transistor of the lower stage, and a control stage in bipolar technology for setting, according to a control voltage applied only on bases of bipolar transistors, two control currents of the half-output stages.

According to an embodiment of the present invention, the control stage includes a first PNP-type bipolar transistor setting a first current for controlling the upper half-stage, a second NPN-type bipolar transistor setting a second current for controlling the lower half-stage, and an input terminal for receiving the control voltage and connected to the respective bases of the first and second bipolar transistors.

According to an embodiment of the present invention, the control stage includes means for setting a current of simultaneous identical conduction of the first MOS transistors when the control voltage is nominal.

According to an embodiment of the present invention, said means include a third NPN-type bipolar transistor interposed between the first bipolar transistor and a current control terminal of the upper half-stage, a first source of a reference current, an output terminal of which is connected to the collector of a fourth NPN-type bipolar transistor, mounted in a current mirror with the third transistor and connected, via a fifth bipolar transistor, to the negative line, and a sixth NPN-type bipolar transistor, diode-mounted between an output terminal of a second source of a reference current and the negative line, the base of the sixth transistor being connected to the base of the fifth transistor.

According to an embodiment of the present invention, a seventh NPN-type bipolar transistor is interposed between the positive line and the common bases of the third and fourth transistors, the base of the seventh transistor being connected to the collector of the fourth transistor.

According to an embodiment of the present invention, resistors of same value are interposed between the respective emitters of the second and sixth bipolar transistors and the negative line, resistors of same value being interposed, respectively, between the first and third bipolar transistors and between the fourth and fifth transistors.

According to an embodiment of the present invention, the reference currents of the two sources are identical.

According to an embodiment of the present invention, the amplifier includes an additional current mirror copying the control current of the lower half-stage, issued by the control stage, on the drain of the MOS transistor mounted as a current mirror on the first MOS transistor of the lower half-stage.

According to an embodiment of the present invention, the additional mirror is comprised of two P-channel MOS transistors.

According to an embodiment of the present invention, the current mirrors constitutive of the upper and lower half-stages exhibit a same ratio.

These objects, characteristics and advantages as well as others, of the present invention, will be discussed in detail in the following non-limiting description of specific embodiments of the present invention, in relation with the accompanying drawings.

DETAILED DESCRIPTION

Figure 1:
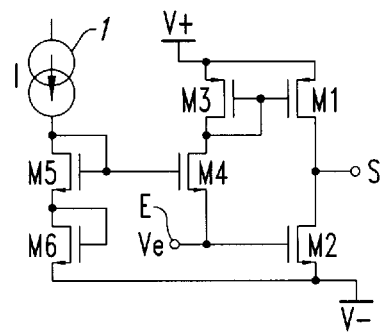
FIG. 1, previously described, is meant to show the state of the art and the problem to solve.
Figure 2:
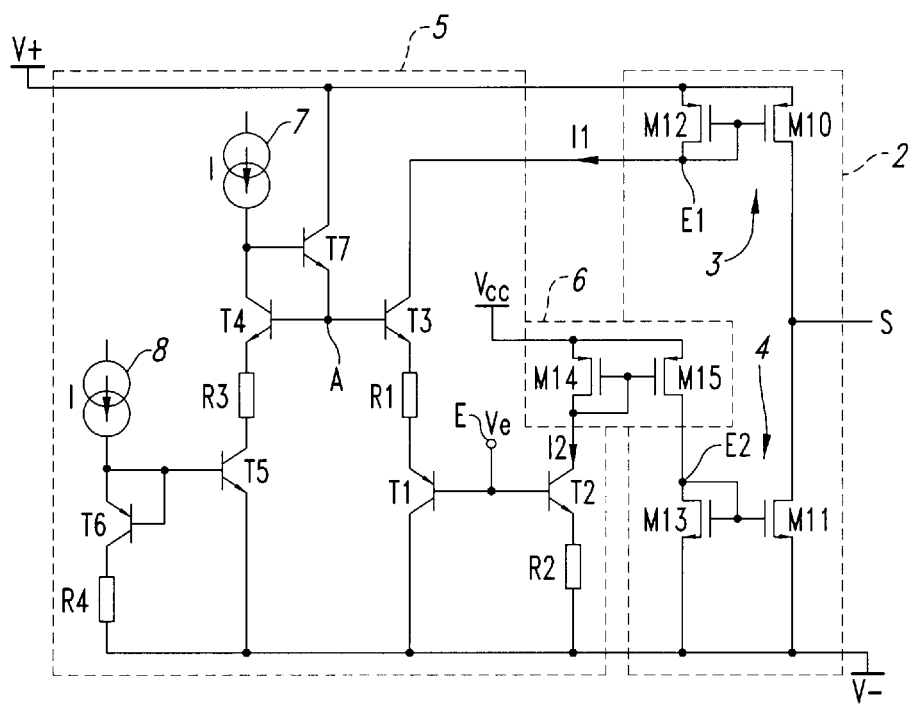
FIG. 2 shows an embodiment of a power amplifier according to the present invention.

For clarity, only the components of the amplifier which are necessary for understanding the present invention have been shown in FIG. 2.

A characteristic of the present invention is to provide a power amplifier in BICMOS technology including an output stage in MOS technology and a control stage in bipolar technology.

Another characteristic of the present invention is to provide an output stage including two MOS transistors mounted in series (rail to rail), each of which belongs to a current mirror assembly.

Another characteristic of the present invention is that the input impedance is set only by the bases of bipolar transistors.

FIG. 2 shows an embodiment of a power amplifier in BICMOS technology according to the present invention. Output stage 2 is comprised of an upper half-stage 3 and of a lower half-stage 4, each half-stage including two MOS transistors mounted as a current mirror.

Each half-stage, respectively 3 and 4, respectively includes a MOS P-channel power transistor M10 and an N-channel power transistor M11, which are mounted in series between the two supply lines, respectively V+ and V− (for example, the ground). The common drains of transistors M10 and M11 constitute an output terminal S of the power amplifier. Transistor M10 is mounted in a current mirror with a P-channel MOS transistor M12, the drain of which constitutes a terminal E1 for controlling half-stage 3 with a current. Transistor M11 is mounted in a current mirror with an N-channel MOS transistor M13, the drain of which constitutes a terminal E2 for controlling half-stage 4 with a current.

According to the present invention, the control of output stage 2 is performed by modifying the currents which flow through transistors M12 and M13. By increasing the current of transistor M12, the current supplied to the load (not shown) connected to terminal S is increased. By increasing the current through transistor M13, the current drawn from the load is increased.

According to the present invention, the respective currents of transistors M12 and M13 are set by a control stage 5 in bipolar technology, a control input E of which receives a control voltage Ve, for example, a sawtooth-shaped signal.

Terminal E is connected to the respective bases of a PNP transistor T1 and an NPN transistor T2. The collector of transistor T1 is connected to line V−. The emitter of transistor T1 is connected, possibly via a resistor R1, to the emitter of an NPN transistor T3, the collector of which is connected to terminal E1. The emitter of transistor T2 is connected, possibly via a resistor R2, to line V−. The collector of transistor T2 is connected to the drain of a P-channel MOS transistor M14 of a current mirror 6, the function of which is to enable the control of half-stage 4 while the flowing directions of the currents through transistors M13 and T2 are the same. For stage 4 to operate, the collector current of transistor T2 has to be copied on the drain of transistor M13.

Mirror 6 is comprised of transistor M14 and of a P-channel MOS transistor M15, the respective gates of which are connected to the drain of transistor M14. The sources of transistors M14 and M15 are connected to a supply voltage Vcc, the potential of which is higher than the potential of line V−. The drain of transistor M15 is connected to terminal E2. Preferably, the surface area ratios of transistors M14 and M15 are identical so that the ratio of mirror 6 is unity. Mirror 6 can, as an alternative, be implemented in bipolar technology.

As previously, the amplifier must avoid the occurrence of a distortion at the linking-up of the negative and positive ranges of the output current. For this purpose, control stage 5 includes means for setting a current of simultaneous conduction of half-stages 3 and 4 when the amplifier is in a state of quiescence, that is, when voltage Ve is equal to a nominal value Vgs0 determined by a conventional loop of the amplifier on its load and when stage 2 must neither absorb nor supply any current on terminal S.

According to the present invention, the base of transistor T3 is connected to the base of an NPN transistor T4, the collector of which receives a reference current I from a source 7. Preferably, the collector of transistor T4 is connected to the base of an NPN transistor T7, the collector of which is connected to line V+ and the emitter of which is connected to the common bases of transistors T3 and T4. The function of transistor T7 is to amplify the base current of transistor T3, since current I generally is low. In some cases, transistor T7 may be suppressed and transistor T3 will then be mounted in a current mirror with transistor T4.

The emitter of transistor T4 is connected, possibly via a resistor R3, to the emitter of a PNP transistor T5, the collector of which is connected to line V−. The base of transistor T5 is connected to the base of an NPN transistor T6, diode-mounted between a source 8 of reference current I and line V−. In some cases, a resistor R4 is interposed between the emitter of transistor T6 and line V−.

Assume that the amplifier is in the quiescent state, that is, potential Ve is such that the drain currents of transistors M10 and M11 are equal (Ve=Vgs0). The following relations then are respected for the potential at connection point A of the gates of transistors T3 and T4:

$V_A = V_{BE}(T4) + R3I + V_{BE}(T5) + V_{BE}(T6) + R4I$; and
$V_A = V_{BE}(T3) + R1I1 + V_{BE}(T1) + V_{BE}(T2) + R2I2$, where I1 and I2 are the collector currents of respective transistors T3 and T2, that is, the control currents of half-stages 3 and 4.

If R1=R3 and R2=R4, and assuming that the bipolar transistors have a same base-transmitter voltage drop ($V_{BE}$), one obtains I2=I1=I.

The current mirrors constituting half-stages 3 and 4 exhibit, preferably, the same ratio K. Thus, a same current KI is obtained in the quiescent state in transistors M10 and M11.

When the potential of terminal E, that is, voltage Ve, increases, potential $V_A$ remains substantially constant and current I1 decreases while current I2 increases. The current drawn from the load increases. Conversely, when voltage Ve decreases, current I1 increases and current I2 decreases. The current supplied to the load increases.

Resistors R1, R2, R3, and R4 are optional. The are used to limit the respective gains of the bipolar transistors and to control the linearity of the gain of stage 5.

An advantage of the present invention is that by making the structure of the output stage symmetrical, the current control of the two half-stages becomes possible.

Another advantage of the present invention is that by means of a control stage in bipolar technology, advantage is taken from the good transconductance of bipolar transistors to convert control voltage Ve into currents I1 and I2 for controlling mirrors constitutive of half-stages 3 and 4.

Another advantage of the present invention is that the input impedance of the amplifier now is symmetrical and high. Indeed, the input impedance is set by the respective bases of transistors T1 and T2, whatever the value of voltage Ve.

Another advantage of the present invention is that it does not need a voltage reference between the supply voltages V+ and V−. It will be noted that voltage Vcc for supplying transistors M14 and M15 may, if necessary, correspond to voltage V+. The only condition is, according to the invention, that voltage Vcc is sufficient (with respect to voltage V−) for transistors M14 and M15 to be on. Thus, the operation of the amplifier is not altered in case voltage V+ (or V−) varies.

Of course, the present invention is likely to have various alterations, modifications, and improvements which will readily occur to those skilled in the art. In particular, the sizings of the MOS power and bipolar transistors are within the abilities of those skilled in the art according to the desired characteristics of the amplifier. Further, FIG. 2 shows a basic diagram. The symmetry and current possibilities can be improved in a conventional way. Moreover, although the present invention has been described in particular reference to an amplifier for controlling a vertical scanning of a television screen, the present invention applies to any type of symmetrical current output amplifier.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A power amplifier having an output stage in MOS technology, including:
    an upper half-output stage comprised of a first and a second P-channel MOS power transistors mounted as a current mirror;
    a lower half-output stage comprised of a first and a second N-channel MOS power transistors mounted as a current mirror;
    an output terminal corresponding to the common drains of the first P-channel MOS power transistor of the upper half-output stage and of the first N-channel MOS power transistor of the lower half-output stage; and
    a control stage in bipolar technology for setting, according to a control voltage, two control currents of the upper half-output stage and the lower half-output stage, the control stage including:
        a first PNP-type bipolar transistor setting a first current for controlling the upper half-stage;
        a second NPN-type bipolar transistor setting a second current for controlling the lower half-stage; and an input terminal for receiving the control voltage and connected to the respective bases of the first and second bipolar transistors.

2. The amplifier according to claim 1 wherein the control stage further includes:
   a third NPN-type bipolar transistor interposed between the first bipolar transistor and a current control terminal of the upper half-stage;
   a first source of a reference current, an output terminal of which is connected to the collector of a fourth NPN-type bipolar transistor, mounted in a current mirror with the third transistor and connected, via a fifth bipolar transistor, to a negative line; and
   a sixth NPN-type bipolar transistor, diode-mounted between an output terminal of a second source of a reference current and the negative line, the base of the sixth transistor being connected to the base of the fifth transistor.

3. The amplifier according to claim 2 wherein a seventh NPN-type bipolar transistor is interposed between a positive line and the common bases of the third and fourth transistors, the base of the seventh transistor being connected to the collector of the fourth transistor.

4. The amplifier according to claim 2 wherein resistors of same value are interposed between the respective emitters of the second and sixth bipolar transistors and the negative line, resistors of same value being interposed, respectively, between the first and third bipolar transistors and between the fourth and fifth transistors.

5. The amplifier according to claim 2 wherein the reference currents of first and second sources of reference current are identical.

6. The amplifier according claim 1 including an additional current mirror, such that the collector of the second bipolar transistor is connected to the drain of a third MOS transistor in the additional current mirror and the collector current of the second bipolar transistor copied onto the drain of the second N-channel MOS power transistor.

7. The amplifier according to claim 6 wherein the third MOS transistor of the additional current mirror is comprised of two P-channel MOS transistors.

8. The amplifier according to claim 1 wherein the current mirrors constitutive of the upper and lower half-stages exhibit a same ratio.

9. A power amplifier implemented in bipolar and MOS technology comprising:
   a first output stage having a first and second MOS transistor connected as a current mirror;
   a second output stage having a first and second MOS transistor connected as a current mirror;
   an output terminal coupled to the output stages; and
   a control stage having bipolar transistors, the control stage having an input terminal for receiving a control voltage and providing, based on the control voltage, a control current through each of the respective output stages, wherein the current through each of the respective output stages is equal when the control voltage is zero.

10. The power amplifier of claim 9 wherein the control stage further comprises:
    a first bipolar transistor of a first type providing the control current for the upper-half output stage;
    a second bipolar transistor of a second type providing the control current for the lower-half output stage; and
    an input terminal for receiving the control voltage coupled to the bases of both of the bipolar transistors.

11. The power amplifier of claim 9 wherein the control stage further comprises:
    a third bipolar transistor having the second type connected in a mirror configuration to a fourth bipolar transistor having the second type, the third bipolar transistor adapted to control the current of the upper half output stage;
    a first current source connected to a negative line through the fourth bipolar transistor and a fifth bipolar transistor having the first type; and
    a sixth bipolar transistor having the second type connected in a mirror configuration to the fifth bipolar transistor, the sixth bipolar transistor connected between a second current source and the negative line.

12. The power amplifier of claim 11 wherein the control stage further comprises:
    a seventh bipolar transistor having the second type connected between a positive line and common bases of the third and fourth transistors, the base of the seventh bipolar transistor coupled to the first current source.

13. The power amplifier of claim 11 wherein the control stage further comprises:
    two resistors of a first value, one each connected between the emitters of the second and sixth bipolar transistors and the negative line;
    one resistor having a second value connected between the fourth and fifth bipolar transistors; and
    one resistor having the second value connected between the first and fourth bipolar transistors.

14. The power amplifier of claim 11 wherein current from the first current source and the second current source have the same values.

15. The power amplifier of claim 9 wherein the control stage further includes:
    a third MOS current mirror duplicating the control current set by the control voltage and providing the duplicated control current to the drain of the second MOS transistor of the lower-half output stage.

16. The power amplifier of claim 9 wherein the current mirror of the upper-half output stage and the current mirror of the lower-half output stage have the same ratio.

17. The power amplifier of claim 9 wherein the first and second MOS transistors connected as a current mirror in the second output stage have N-type channels.

18. The power amplifier of claim 10 wherein the bipolar transistor of the first type is a PNP transistor.

* * * * *